United States Patent [19]

Hosoki

[11] Patent Number: 5,393,983
[45] Date of Patent: Feb. 28, 1995

[54] MAGNETIC ELECTRON LENS AND ELCTRON MICROSCOPE USING THE SAME

[75] Inventor: Shigeyuki Hosoki, Hachioji, Japan
[73] Assignee: Hitachi, Ltd., Tokyo, Japan
[21] Appl. No.: 50,044
[22] PCT Filed: Aug. 26, 1992
[86] PCT No.: PCT/JP92/01076
  § 371 Date: Apr. 28, 1993
  § 102(e) Date: Apr. 28, 1993
[87] PCT Pub. No.: WO93/05529
  PCT Pub. Date: Mar. 18, 1993
[30] Foreign Application Priority Data
  Aug. 30, 1991 [JP]  Japan .................... 3-220093
[51] Int. Cl.⁶ .......................................... H01J 37/141
[52] U.S. Cl. ........................ 250/396 ML; 250/311; 335/210; 335/216
[58] Field of Search ............ 250/396 ML, 396 R, 311; 335/210, 216

[56] References Cited
U.S. PATENT DOCUMENTS

| 3,587,013 | 6/1971 | Dietrich et al. | 335/210 |
| 3,708,772 | 1/1973 | LeFranc | 335/210 |
| 3,900,808 | 8/1975 | Zerbst et al. | 335/216 |
| 3,916,201 | 2/1974 | Herrmann et al. | 250/396 |

OTHER PUBLICATIONS

Electron Microscopy and Analysis, Proceedings Of The Institute Of Physics Conference, Cambridge, UK Sep. 1981, pp. 91-94, Lefranc et al, "Asymmetric superconducting shielding lens for Tem and Stem".

Primary Examiner—Jack I. Berman
Attorney, Agent, or Firm—Antonelli, Terry, Stout & Kraus

[57] ABSTRACT

A magnetic electron lens for use in charged particle beam-applied apparatuses such as electron microscopes, the lens having concave lens characteristics in a geometric-optical sense. The magnetic concave lens of the invention comprises a first and a second magnetic field generating coil arranged in the propagating direction of the charged particle beam, and a first and a second magnetic shielding plate made of a superconductor each and furnished so as to enclose the first and the second magnetic field generating coils. The first magnetic shielding plate shields the magnetic field generated above the first magnetic field generating coil, and the second magnetic shielding plate shields the magnetic field generated under the second magnetic field generating coil. This setup constitutes a magnetic electron lens that is concave in terms of geometric-optical lens characteristics.

13 Claims, 5 Drawing Sheets

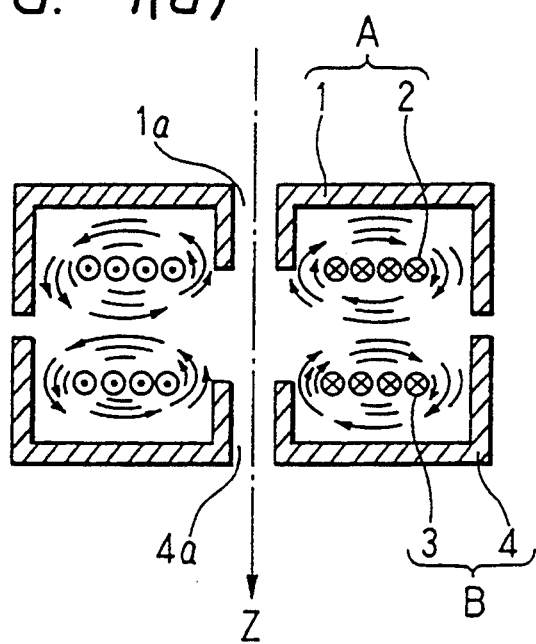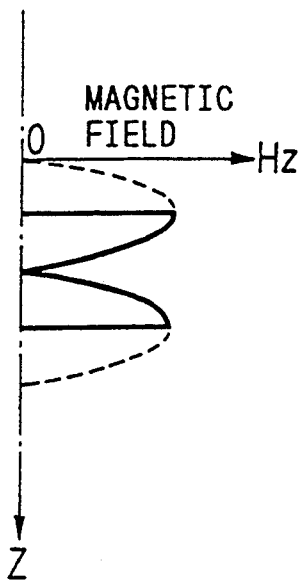

MAGNETIC ELECTRON LENS AND ELCTRON MICROSCOPE USING THE SAME

BACKGROUND OF THE INVENTION

1. Field of the Invention

The present invention relates to improvements in a magnetic electron lens. More particularly, the invention relates to improvements in a magnetic electron lens used to focus and enlarge a charged particle beam by the whole range of charged particle beam-applied equipment including electron beam instruments such as electron microscopes and micro-probe secondary ion mass-spectrometers.

2. Description of the Prior Art

Heretofore, electrostatic and magnetic electron lenses have been used to focus and enlarge a charged particle beam (electron beam or ion beam) by electron beam-applied equipment such as electron microscopes as well as by ion beam-applied equipment such as micro-probe secondary ion mass-spectrometers. Of these types of equipment, high-magnification electron microscopes designed particularly to observe the structure of specimens on the atomic scale need to use an electron lens with a small amount of lens aberrations to ensure specimen images of high magnification and resolution. The lenses that meet the above requirement are primarily magnetic electron lenses having smaller absolute values of lens aberrations than electrostatic electron lenses.

Up to now, the prior art magnetic electron lens can only constitute a convex lens, not a concave lens. There has been no conventional technique for combining the convex and concave lenses to minimize the amount of aberrations, as is customary with optical lens systems. While the resolution of optical microscopes is on the order of the wavelengths of the light used, electron microscopes (typically those that use an electron beam accelerated at 100 kV) have a resolution of about 0.1 nm as opposed to the electron beam wavelength of about 4 pm. That is, the resolution of electron microscopes is not high enough when compared with the wavelength of the electron beam employed. The cause of limit lies mostly in the influences of such lens aberrations as spherical aberration and chromatic aberration, which are attribution of the electron lens itself. (As theoretically unavoidable effects, there are diffraction aberration and the interaction between electron beam and inner electrons of a specimen, which are small enough. Traditionally, it has been considered impossible to correct the effects of the above-mentioned lens aberrations. A new technology such as electron beam holography, has been developed originally to eliminate the effects of spherical aberration that is intrinsic to the objective lens of electron microscopes. The electron beam holography technology constitutes from recording of electron diffracted images (Fourier transformed images) with using a coherent electron beam and optical inverse Fourier transformation using a laser beam. The purpose of this technology is to minimize the effects of aberrations of the electron lens. Publications associated with this field include "Theory and Application of Electron Microscope I" (edited by Japanese Society of Electron Microscope, published by Maruzen Co., Ltd., Tokyo, October 1959) and "The Electron Microscope" (E. & F. N. Spon Limited, London, 1961).

Because prior art magnetic electron lenses can only constitute the convex lens arrangement as described, there has been no way of combining, as in optical lens systems, a convex lens with a concave lens to correct the aberration of the convex lens. It is for this reason that electron microscopes utilizing the prior art magnetic electron lens have failed to provide sufficiently high resolution. The same can be said for the whole range of charged particle beam-applied equipment employing a finely focused electron beam or ion beam.

SUMMARY OF THE INVENTION

It is therefore an object of the present invention to provide a magnetic electron lens having concave lens characteristics.

It is another object of the invention to provide a magnetic composite electron lens which, reduces drastically the amount of lens aberrations when combined with the prior art magnetic electron lens having the convex lens characteristics.

It is a further object of the invention to provide an electron microscope which, using the magnetic composite electron lens according to the invention, permits observation of specimen images at high levels of magnification and resolution.

In achieving the foregoing and other objects of the present invention and according to one aspect thereof, there is provided a magnetic electron lens comprising: a first and a second magnetic field generating coil made of a superconductor each and located one on top of the other in the propagating direction of a charged particle beam; and a first and a second magnetic shielding plate made of a superconductor each and furnished so as to enclose the first and the second magnetic field generating coils, the first magnetic shielding plate being located above the first magnetic field generating coil, the second magnetic shielding plate being positioned under the second magnetic field generating coil; wherein the first magnetic shielding plate shields the magnetic field generated above the first magnetic field generating coil and the second magnetic shielding plate shields the magnetic field generated under the second magnetic field generating coil. In this setup, the upper portion of the magnetic field generated by the first magnetic field generating coil, i.e., the portion above the peak value of the magnetic field in its bell-shaped distribution, is shielded by the first magnetic shielding plate. The lower portion of the magnetic field generated by the second magnetic field generating coil, i.e., the portion under the peak value of the magnetic field in its bell-shaped distribution, is shielded by the second magnetic shielding plate. The result is a magnetic electron lens of which the magnetic field has a valley-shaped distribution and which has concave lens characteristics in a geometric-optical sense.

In a preferred structure according to the invention, the magnetic electron lens having the concave lens characteristics has its second magnetic field generating coil and its second magnetic shielding plate (i.e., lower lens portion) combined with a third magnetic field generating coil and a third magnetic shielding plate, the third coil and third plate made of a superconductor each and constituting a magnetic electron lens portion (i.e., upper lens portion) having convex lens characteristics. This structure offers a magnetic composite electron lens (convex lens) with its amount of lens aberrations drastically reduced.

In a further preferred structure according to the invention, the magnetic electron lens having the concave lens characteristics has its second magnetic field generating coil and its second magnetic shielding plate (i.e., lower lens portion) combined with a fourth magnetic field generating coil and a fourth magnetic shielding plate, the fourth coil and fourth plate made of a paramagnetic material each and constituting a magnetic electron lens portion (i.e., upper lens portion) having convex lens characteristics. This structure also offers a magnetic composite electron lens (convex lens) with its amount of lens aberrations reduced dramatically.

Where the prior art magnetic electron lens generates a symmetrical magnetic field around the center axis of an incident charged particle beam, the axial distribution of magnetic field intensity of the lens is always bell-shaped. That is, although different types of lenses have magnetic field distribution patterns that are somewhat different in detail, the prior art magnetic electron lens always has its axial distribution of magnetic field intensity start from the lens top (where magnetic field intensity $Hz=0$) and increase progressively up to the lens center (where magnetic field intensity $Hz=$maximum). Past the lens center, the axial distribution of magnetic field intensity gradually drops until the lens bottom (where magnetic field intensity $Hz=0$). Because the prior art magnetic electron lens has only this kind of axial distribution of magnetic field intensity, the lens can only act as a convex lens with respect to the incident charged particle beam.

To have the magnetic electron lens act as a concave lens requires that the lens possess a valley-shaped axial distribution pattern of magnetic field intensity. That is, the axial distribution of magnetic field intensity should have a maximum intensity value ($Hz=$maximum) at the lens top, a minimum intensity value ($Hz=$minimum) at the lens center, and again a maximum intensity value ($Hz=$maximum) at the lens bottom. This valley-shaped axial distribution of magnetic field intensity is now provided by the present invention comprising two major arrangements: (1) magnetic shielding plates made of superconductors for completely preventing any magnetic field from occurring above the lens top and under the lens bottom; and (2) magnetic field generating coils made of superconductors for generating magnetic fields of sufficiently high intensity.

These and other objects, features and advantages of the invention will become more apparent upon a reading of the following description and appended drawings.

BRIEF DESCRIPTION OF THE DRAWINGS

FIG. 1(A) is a longitudinal sectional view showing the theoretical constitution of a magnetic electron lens embodying the present invention;

FIG. 1(B) is a view depicting by curves the distribution pattern of magnetic fields generated by the magnetic electron lens of FIG. 1(A);

DESCRIPTION OF THE PREFERRED EMBODIMENTS

Figure 2:
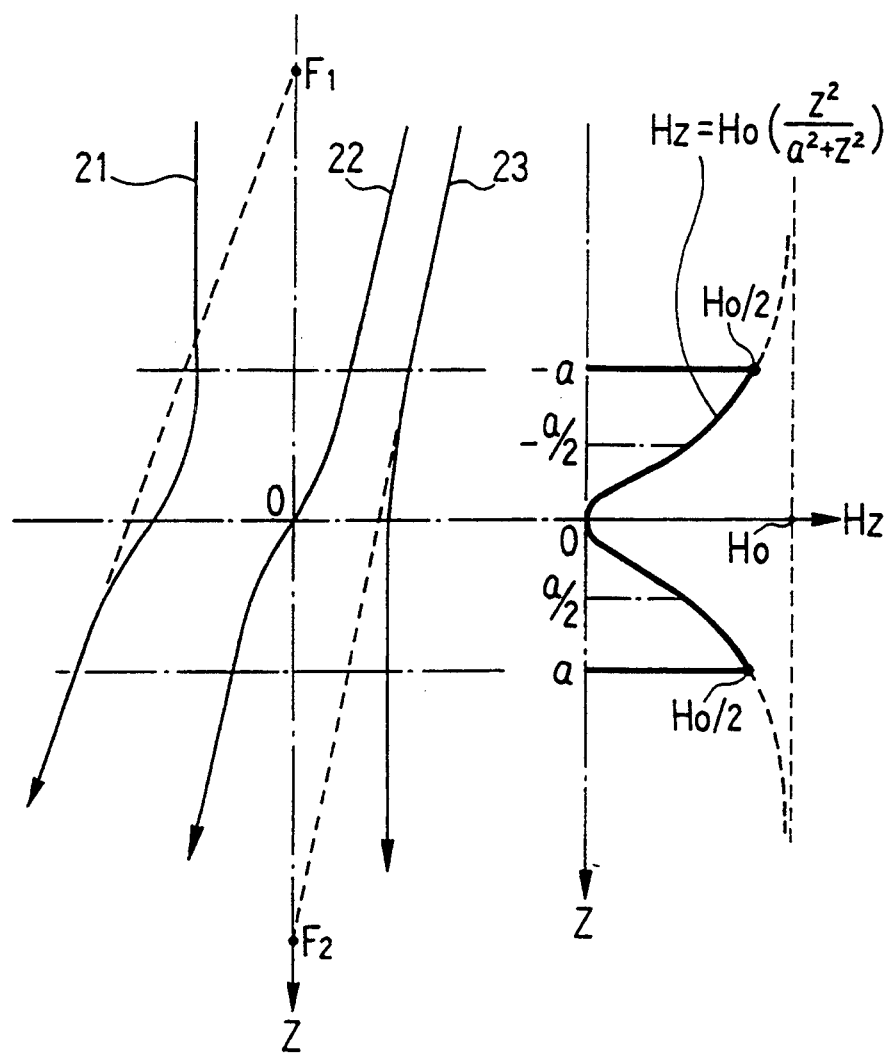
FIG. 2 is a view showing how the magnetic field distribution of the magnetic electron lens embodying the invention is typically related to the electron beam orbit thereof.

Preferred embodiments of the invention will now be described with reference to the accompanying drawings.

The basic constitution of a magnetic electron lens having concave lens characteristics according to the invention will be first described with reference to FIG. 1. In FIG. 1, a first and a second magnetic shielding plate 1 and 4, and a first and a second magnetic field generating coil (or ring) 2 and 3 are located in the propagating direction (i.e., Z axis) of a charged particle beam. The magnetic shielding plates 1 and 4 as well as the magnetic field generating coils 2 and 3 are made of a superconductor each. Each of the magnetic shielding plates 1 and 4 is of a donut-shaped construction made of thin superconducting plates, the center of the construction having cylindrical apertures 1a and 4a through which the charged particle beam is allowed to pass. The magnetic shielding plates 1 and 4 constitute a magnetic shielding body that utilizes the anti-ferromagnetism of superconductors. The magnetic shielding plate 1 is located to enclose the upper half of the coil 2 so as to shield effectively the magnetic field occurring above that coil. The magnetic shielding plate 4 is positioned to enclose the lower half of the coil 3 in order to shield effectively the magnetic field generated under that coil.

The magnetic field generating coils 2 and 3 are furnished inside the spaces enclosed respectively by the magnetic shielding plates 1 and 4. Getting currents to flow into the coils 2 and 3 generates magnetic fields in the directions shown by arrows in FIG. 1(A). Consider a hypothetical case where the magnetic shielding plates 1 and 4 are absent and only the coils 2 and 3 are independently present. In that case, the intensity Hz of the axial magnetic field formed inside a beam passage through each of the beam passing cylindrical apertures 1a and 4a appears bell-shaped, as indicated by broken line in FIG. 1(B). The distribution pattern of this magnetic field intensity is similar to that of conventional magnetic electron lenses. By contrast, the above-described lens constitution according to the invention is innovative in that the magnetic shielding plates 1 and 4 are furnished to keep the magnetic fields of the coils 2 and 3 from leaking upward and downward, respectively. As shown by solid line in FIG. 1(B), the intensity Hz of the axial magnetic field generated by the coil 2 abruptly drops to zero from its peak position upward. Similarly, the intensity Hz of the axial magnetic field generated by the coil 3 suddenly drops to zero from its peak position downward. That is, the lens constitution according to the invention provides the so-called valley-shaped distribution of axial magnetic field intensity.

The valley-shaped distribution of axial magnetic field intensity functions as a concave lens with respect to the charged particle beam (electron beam) coming in along the beam axis (i.e., Z axis) as illustrated in FIG. 2. FIG. 2 depicts the orbit of the incident electron beam within the distribution pattern of axial magnetic field intensity shown by solid line in FIG. 1(B). An electron beam 21 entered in parallel with the Z axis starts progressing straight past the lens as if the beam originated from a focal point $F_1$. Another electron beam 22 passing through a lens center O moves on past the lens in the same direction as the incident direction. Another electron beam 23 coming in toward a focal point $F_2$ starts progressing in parallel with the Z axis once the beam has passed through the lens. These characteristics precisely indicate the formation of a concave lens.

More specifically, the intensity Hz of the axial magnetic field in FIG. 2 takes the distribution pattern characterized as follows: The intensity Hz rises abruptly at the lens top ($Z = -a$) from a minimum value (Hz=0) to a maximum value (Hz=$H_0/2$), and falls abruptly at the lens bottom (Z=a) from the maximum (Hz = $H_0/2$) to the minimum (Hz=0). Between lens top and lens bottom, the axial magnetic field intensity Hz varies along the curve represented by the expression $$Hz = H_0 [Z^2/(a^2+Z^2)]$$

whereby the so-called valley-shaped distribution pattern is plotted.

Figure 3A:
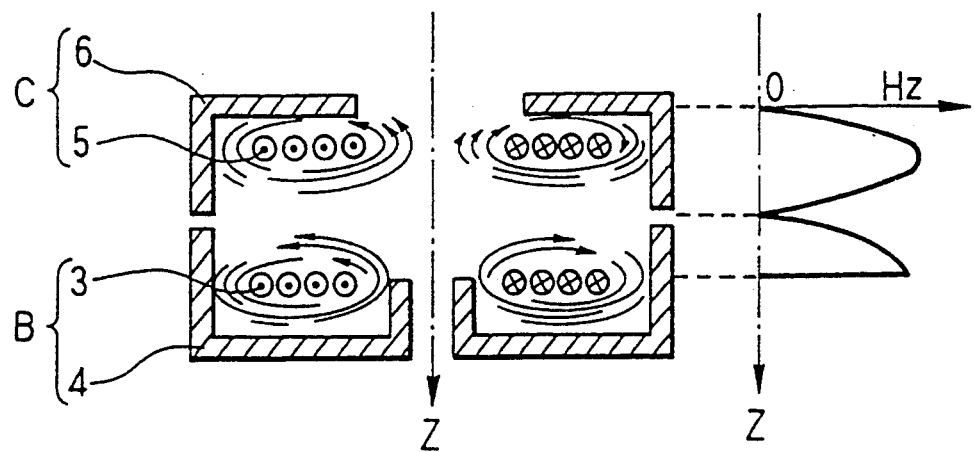
FIG. 3(A) is a schematic view illustrating the overall constitution of a magnetic composite lens embodying the invention.

The magnetic electron lens according to the invention and having the concave lens characteristics described above may be used in combination with a conventional magnetic electron lens (convex lens). What follows is a description of a typical objective lens of an electron microscope, the objective lens being practiced as a magnetic electron lens embodying the invention. FIG. 3(A) is a longitudinal sectional view of the electron microscope objective lens according to the invention. In FIG. 3(A), reference numeral 5 is a third coil made of a superconductor for generating a magnetic field, and reference numeral 6 is a third magnetic shielding plate composed of a superconductor. The magnetic shielding plate 6 does not completely enclose the upper space of the coil 5. Thus the axial magnetic field generated above the coil 5 is not shielded completely. As a result, the magnetic field generated by the coil 5 takes the conventional bell shape.

The third coil 5 and the third magnetic shielding plate 6 made of superconductors combine to constitute the upper half portion C of the magnetic electron lens. As with conventional magnetic electron lenses, this upper half portion manifests only the characteristics of a convex lens. In combination with the upper half portion C, the lower half portion B made of the second coil 3 and second magnetic shielding plate 4 takes the so-called valley-shaped magnetic field distribution pattern. That is, thanks to the function of its upper half portion C, the magnetic lens of this example acts basically as an objective lens (i.e., convex lens). The lower half portion B with its concave lens characteristics is added so as to correct part of the spherical and chromatic aberrations caused by the upper half portion C acting as the convex lens.

As stated, the entire lens construction is simpler if the upper and lower half portions C and B (convex and concave lenses) are combined to make up a composite lens, as shown in FIG. 3, than if only one magnetic electron lens is constructed to exhibit the convex lens characteristics, as depicted in FIG. 1. As mentioned, the coils 3 and 5 and the magnetic shielding plates 4 and 6 are made of superconductors such as lead (Pb) and tin-niobate ($Nb_3Sn$) which are cooled by liquid helium (He). As a less advantaged approach, the coils 3 and 5 and the magnetic shielding plates 4 and 6 can be made of a paramagnetic material.

Figure 3B:
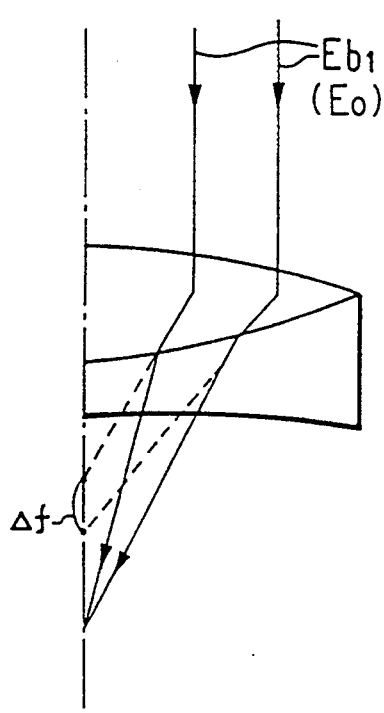
FIG. 3(B) is a view describing how the spherical aberration of the magnetic composite lens in FIG. 3(A) is corrected illustratively.
Figure 3C:
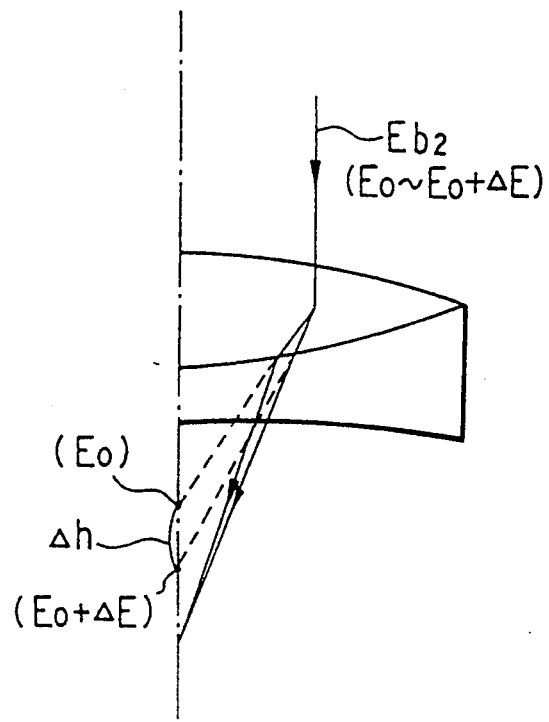
FIG. 3(C) is a view showing how the chromatic aberration of the magnetic composite lens in FIG. 3(A) is corrected illustratively.
Figure 4:
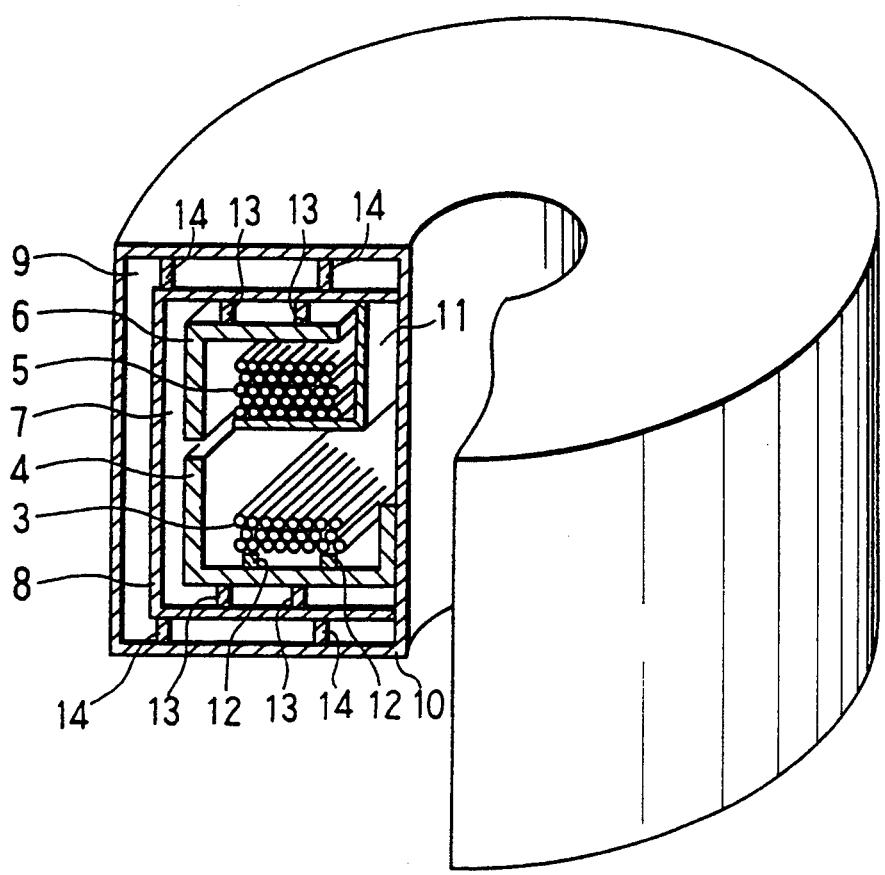
FIG. 4 is a view depicting a specific constitution of the magnetic composite lens embodying the invention.

FIG. 4 is a view depicting a specific constitution of the magnetic composite lens sketched in FIG. 3 and embodying the invention. As illustrated in FIG. 4, a liquid helium chamber 7 surrounds the magnetic shielding plates 4 and 6. Around the plates 4 and 6 is a liquid nitrogen chamber 9. The liquid helium chamber 7 is filled with liquid helium. Inside the chamber 7 are the magnetic shielding plates 4 and 6 as well as the coils 3 and 5. The magnetic shielding plates 4 and 6 are fixedly attached via support members 13 to a chamber wall 8 made of a magnetic permeable material. The coils 3 and 5 are secured to the chamber wall 8 via support members 12 and 11, respectively. Around the outer circumference of the chamber wall 8 is a chamber wall 10 also made of a magnetic permeable material. A liquid nitrogen chamber 9 formed between the walls 8 and 10 is filled with liquid nitrogen. The chamber walls 8 and 10 are firmly secured to each other via support rods 14. Although further details are omitted from FIG. 4, the magnetic shielding plates 4 and 6 as well as the coils 3 and 5 made of superconductors are mechanically attached in a sufficiently secure manner so that the superconducting state will be kept stable against external vibrations. Also omitted from FIG. 4 are power circuits for activating the coils 3 and 5 and the electrical connections and switch circuits for shifting these coils from paramagnetic state to superconducting state. These components are built and furnished in ways known to the technical field in question.

The composite electron lens of FIG. 4 corrects most of the spherical aberration $\Delta f$ of an energy-coherent incident electron beam $Eb_1$ (energy: $E_0$), as shown in FIG. 3(B). The composite electron lens also corrects most of the chromatic aberration $\Delta h$ of an energy-incoherent incident electron beam $Eb_2$ (energy: $E_0 - E_0 + \Delta E$), as illustrated in FIG. 3(C). Thus if the composite electron lens according to the invention is used as the objective lens of an electron microscope, the microscope will have a much higher level of resolution than ever before. When the convex lens portion is combined with the concave lens portion, the resulting composite lens has a longer focal length than the comparable objective lens (i.e., convex lens portion). However, it should be noted that the longstanding need for shortening the focal point of the objective lens in the electron microscope originated from the desire to minimize the amount of spherical and chromatic aberrations in the first place. In that sense, the somewhat extended focal length of the composite electron lens hardly detracts from the otherwise advantageous features thereof. If it is still desired to shorten the focal length with the composite lens constitution, suitable means may be provided for strong excitation of the composite lens. Since the coils 3 and 5 are made of superconductors, it should be quite easy to excite them strongly enough to shorten the focal length appreciably.

In the above example, the composite lens has its upper half portion (convex lens portion) made up of the coil 5 and magnetic shielding plate 6, both composed of superconductors, the upper half portion being cooled by liquid helium (He) down to extremely low temperatures. Alternatively, the coil 5 and magnetic shielding plate 6 may be constituted by paramagnetic materials. If the upper half portion of the composite lens (convex lens portion) is composed of paramagnetic materials, they replace the costly superconductors and will thus make the lens assembly less expensive.

When images are observed by an electron microscope that uses the above-described composite electron lens as its objective lens, the chromatic aberration on the optical axis cannot be corrected. In that case, images of still higher resolution may be obtained by resorting to the so-called dark field observation method whereby only the transmitted waves over the optical axis are kept out of imaging. The combination of the convex and concave lenses, as practiced in the above example, is also effective when applied to the condenser lens of the electron microscope. Where a field emission cathode is employed as the electron beam source, the composite electron lens is effective in irradiating a focused electron beam to a specimen while keeping the beam strictly coherent.

Figure 5:
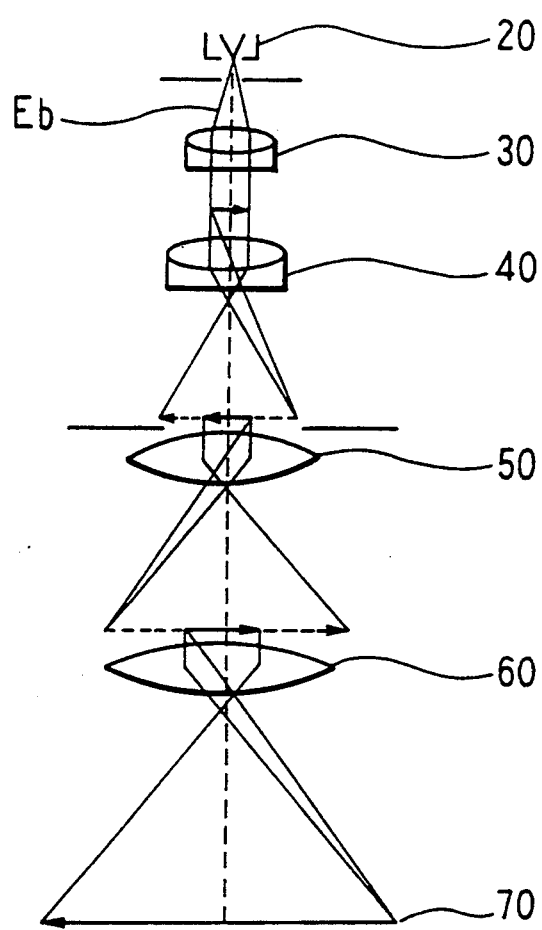
FIG. 5 is a view showing the geometric-optical imaging condition of an electron microscope incorporating the magnetic electron lens according to the invention.

FIG. 5 shows a typical constitution of an electron microscope incorporating the magnetic electron lens composed of a convex and a concave lens according to the invention. This figure indicates how images are formed between an electron beam source 20 and a fluorescent screen 70 along an electron beam Eb in a geometric-optical sense. In FIG. 5, reference numeral 30 is a condenser lens and numeral 40 is an objective lens. The two lenses are magnetic electron lenses each made of a convex and a concave lens. Reference numerals 50 and 60 are an intermediate lens and a projection lens, respectively.

The magnetic electron lens according to the invention may be used in diverse applications ranging from electron microscopes of medium to high voltages (e.g., with electron beam acceleration energy of several to tens of keV) to electron microscopes of ultra high voltages (e.g., with acceleration energy of 1 to 3 Mev). Because the invented lens requires a liquid helium-based cooling construction, small-size (i.e., low-voltage) electron microscopes of several keV or less in acceleration energy may become somewhat bulky when incorporating the lens. However, with the invented lens incorporated, large-scale (i.e., high-voltage) electron microscopes of tens of keV or higher in acceleration energy are virtually the same in machine size as the prior art electron microscopes of the comparable acceleration energy levels. Thus the invention is particularly suitable to the large-scale category of electron microscopes. Where it is desired to apply the magnetic electron lens of the invention to small-size (low-voltage) electron microscopes of several keV or lower in acceleration energy, the lower levels of acceleration energy necessitate correspondingly lower levels of critical magnetic field of the superconductors involved. It is then feasible to make the cooling structure of the small-size electron microscope simpler and smaller by use of higher temperature superconductors such as the perovskite-type superconductor (of the BaYCuO family); this type of superconductor may be brought into superconducting state solely by the cooling process based on liquid nitrogen.

As described, the present invention turns the magnetic electron lens into a concave lens, which was unavailable with the prior art. Because it is possible to correct the aberrations of the concave type magnetic electron lens, the electron microscope incorporating the lens is boosted significantly in its resolution. Since the diffraction aberration cannot be corrected even with the invented lens, it is necessary to select a greater irradiation angle $\theta$ of the electron beam to minimize the diffraction aberration-induced imaging error (amount of error $d = 0.61 \lambda/\sin \theta$; where $\theta$ is the irradiation angle of the electron beam relative to the specimen and $\lambda$ is the electron beam wavelength) for higher resolution. Conventionally, attempts to reduce the spherical aberration of the magnetic electron lens were in conflict with attempts to minimize the diffraction aberration thereof with respect to the irradiation angle $\theta$ of the electron beam. It was therefore necessary to select an electron beam irradiation angle $\theta$ such that would minimize the two kinds of aberration. By contrast, the invention allows the irradiation angle $\theta$ to be set to a sufficiently large value (about $10^{-1}$ rad.). This in turn makes it possible to reduce the imaging error caused by diffraction aberration to a negligible level. The lowered diffraction aberration combines with the above-described reductions in spherical and chromatic aberrations to provide a drastic improvement in the resolution of electron microscopes.

While preferred embodiments of the invention have been described using specific terms, such description is for illustrative purposes only, and it is to be understood that changes and variations may be made without departing from the spirit or scope of the following claims.

What is claimed is:

1. A magnetic electron lens comprising:
   a first and a second magnetic field generating coil made of a paramagnetic material each and located one on top of the other in the propagating direction of a charged particle beam; and
   a first and a second magnetic shielding plate made of a paramagnetic material each and furnished so as to enclose said first and said second magnetic field generating coils, said first magnetic shielding plate being located above said first magnetic field generating coil, said second magnetic shielding plate being positioned under said second magnetic field generating coil;
   wherein said second magnetic shielding plate shields the magnetic field generated under said second magnetic field generating coil.

2. A magnetic electron lens according to claim 1, further comprising a liquid helium-based cooling mechanism for cooling to extremely low temperatures said first and said second magnetic field generating coils made of paramagnetic materials as well as said first and said second magnetic shielding plates also made of paramagnetic materials.

3. A magnetic electron lens according to claim 1, further comprising a liquid nitrogen-based cooling mechanism for cooling to extremely low temperatures said first and said second magnetic field generating coils made of paramagnetic materials as well as said first and said second magnetic shielding plates also made of paramagnetic materials.

4. A magnetic electron microscope incorporating as the objective lens thereof a magnetic electron lens according to claim 1.

5. A magnetic electron lens comprising:
   a first magnetic field generating coil made of a superconductor;
   a second magnetic field generating coil made of a superconductor and positioned under said first magnetic field generating coil in a propagating direction of a charged particle beam;
   a first magnetic shielding plate made of a superconductor and disposed above said first magnetic field generating coil so as to enclose an upper side of said first magnetic field generating coil; and a second magnetic shielding plate made of a superconductor and disposed under said second magnetic field generating coil so as to enclose a lower side of said second magnetic field generating coil;

wherein said first magnetic shielding plate shields the magnetic field generated above said first magnetic field generating coil and said second magnetic shielding plate shields the magnetic field generated under said second magnetic field generating coil, such that a valley-shaped magnetic field distribution is obtained along a propagation path of said charged particle beam as defined between said first magnetic shielding plate and said second magnetic shielding plate.

6. A magnetic electron lens comprising:

a first magnetic field generating coil made of a superconductor;

a second magnetic field generating coil made of a superconductor and positioned under said first magnetic field generating coil in a propagating direction of a charged particle beam;

a first magnetic shielding plate made of a superconductor and disposed above said first magnetic field generating coil so as to enclose a part of an upper side of said first magnetic field generating coil; and a second magnetic shielding plate made of a superconductor and disposed under said second magnetic field generating coil so as to enclose a lower side of said second magnetic field generating coil;

wherein said second magnetic shielding plate shields a magnetic field generated under said second magnetic field generating coil, such that a valley-shaped magnetic field distribution is obtained in the portion between said first and second magnetic field generating coils.

7. A magnetic electron lens as claimed in claim 6, further comprising a liquid helium-based cooling mechanism for cooling to extremely low temperatures said first and said second magnetic field generating coils as well as said first and said second magnetic shielding plates.

8. A magnetic electron lens as claimed in claim 6 further comprising a liquid nitrogen-based cooling mechanism for cooling to extremely low temperatures said first and said second magnetic field generating coils as well as said first and said second magnetic shielding plates.

9. A magnetic electron microscope incorporating as an objective lens thereof a magnetic electron lens as claimed in claim 6.

10. A magnetic electron lens comprising:

a first field generating coil made of a paramagnetic material;

a second magnetic field generating coil made of a superconductor and positioned under said first magnetic field generating coil in a propagating direction of a charged particle beam;

a first magnetic shielding plate made of a para-magnetic material and disposed above said first magnetic field generating coil so as to enclose a part of an upper side of said first magnetic field generating coil; and a second magnetic shielding plate made of a superconductor and disposed under said second magnetic field generating coil so as to enclose a lower side of said second magnetic field generating coil, wherein said second magnetic shielding plate shields a magnetic field generated under said second magnetic field generating coil, such that a valley-shaped magnetic field distribution is obtained in the portion between said first and said second magnetic field generating coils.

11. A magnetic electron lens as claimed in claim 10, further comprising a liquid helium-based cooling mechanism for cooling to extremely low temperatures said second magnetic field generating coil and said second magnetic shielding plate.

12. A magnetic electron lens as claimed in claim 10, further comprising a liquid nitrogen-based cooling mechanism for cooling to extremely low temperatures said second magnetic field generating coil and said second magnetic shielding plate.

13. A magnetic electron microscope incorporating as an objective lens thereof a magnetic electron lens as claimed in claim 10.

* * * * *